United States Patent
Wu et al.

(10) Patent No.: US 8,427,460 B2
(45) Date of Patent: Apr. 23, 2013

(54) FLAT DISPLAY PANEL

(75) Inventors: Hung-Chang Wu, Tainan County (TW); Shian-Yi Huang, Taipei County (TW); Shih-Chieh Lo, Taoyuan County (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 736 days.

(21) Appl. No.: 12/325,259

(22) Filed: Nov. 30, 2008

(65) Prior Publication Data
US 2009/0251447 A1 Oct. 8, 2009

(30) Foreign Application Priority Data
Apr. 7, 2008 (TW) ................................ 97112490 A

(51) Int. Cl.
*G09G 5/00* (2006.01)
(52) U.S. Cl.
USPC ............. 345/205; 257/355; 257/360; 345/87; 345/55; 349/40; 349/54; 349/55; 349/192
(58) Field of Classification Search .................. 345/204; 259/40, 140
See application file for complete search history.

(56) References Cited

U.S. PATENT DOCUMENTS

| | | | | |
|---|---|---|---|---|
| 5,303,074 A * | 4/1994 | Salisbury | ........................ | 349/55 |
| 6,122,030 A * | 9/2000 | Nagata et al. | ................. | 349/153 |
| 6,175,394 B1 * | 1/2001 | Wu et al. | ........................ | 349/40 |
| 6,493,047 B2 * | 12/2002 | Ha | .................. | 349/40 |
| 6,614,053 B1 * | 9/2003 | Takenaka | ........................ | 257/66 |
| 6,696,701 B2 * | 2/2004 | Hector et al. | ................... | 257/72 |
| 6,791,632 B2 * | 9/2004 | Lee et al. | ........................ | 349/40 |
| 7,304,351 B2 * | 12/2007 | Liu et al. | ........................ | 257/355 |
| 7,379,127 B2 * | 5/2008 | Tsao | .............................. | 349/40 |
| 2001/0050835 A1 * | 12/2001 | Uchida | ......................... | 361/111 |
| 2006/0145951 A1 * | 7/2006 | Watanabe et al. | ............... | 345/55 |
| 2007/0007523 A1 | 1/2007 | Lai | | |
| 2007/0046845 A1 * | 3/2007 | Liou et al. | ...................... | 349/40 |

FOREIGN PATENT DOCUMENTS

| | | |
|---|---|---|
| CN | 1396656 | 2/2003 |
| CN | 1877399 | 12/2006 |

OTHER PUBLICATIONS

"1stOA Office Action of Chinese Counterpart Application" issued on Mar. 8, 2010, p. 1-p. 5.

\* cited by examiner

*Primary Examiner* — Grant Sitta
(74) *Attorney, Agent, or Firm* — Jianq Chyun IP Office

(57) ABSTRACT

A flat display panel is provided. The flat display panel includes a substrate, a first driving line, a second driving line, and an ESD protection circuit. The ESD protection circuit includes a first crossing line, a second crossing line, and a first ESD protection device. The first crossing line crosses over the first driving line in a first crossing place. The second crossing line crosses over the second driving line in a second crossing place. The first ESD protection device is electrically connected to the first crossing line and to the second crossing line. Therefore, the flat display panel can avoid current leakage occurring when the first crossing place or the second crossing place is damaged.

5 Claims, 3 Drawing Sheets

FLAT DISPLAY PANEL

CROSS-REFERENCE TO RELATED APPLICATION

This application claims the priority benefit of Taiwan application serial no. 97112490, filed on Apr. 7, 2008. The entirety of the above-mentioned patent application is hereby incorporated by reference herein and made a part of specification.

BACKGROUND OF THE INVENTION

1. Field of the Invention

The present invention relates to a flat panel display, and in particular, to a flat display panel having an electronic static discharge (ESD) protection circuit.

2. Description of Related Art

ESD is a common phenomenon in our daily life. Basically, because the electron affinity of each object is different, when any two objects contact and separate, electric charges are easily transferred between the two objects. Therefore, static electricity is accumulated. When the accumulation of the static electricity of the object exceeds a certain amount, and the object with static electricity contacts or approaches another object having different electric potential, the electric charges are transferred, which is called ESD.

More specifically, electronic products are likely to be damaged by the ESD during the manufacture, production, assembly, transportation, and even the improper use by a consumer. Therefore, the electronic products have to be equipped with an ESD protection design, so that the life span of the electronic products can be prolonged. Especially, the ESD protection design should be integrated in the products manufactured by using an advanced semiconductor manufacturing process, such as an integrated circuit (IC), a flat display panel, and etc. The reason is that the sizes of the components thereof are small, and therefore inner circuits of the IC or the flat panel display are easily damaged permanently by the ESD with a high voltage, which causes malfunction of the components.

In the flat panel displays nowadays, the effect of the ESD may cause a dot defect or a line defect of the flat panel displays. The occurrence of the ESD can not be avoided completely during the process of manufacturing the flat panel display, and therefore, conventional techniques often adopt an ESD protection circuit in the flat panel display to prevent the damage caused by the ESD. In the flat panel displays nowadays, the common ESD protection circuit is an inner short ring (ISR).

FIG. 1 is a schematic view of a conventional ESD protection circuit. Please refer to FIG. 1. The flat display panel 10 includes a substrate 70, a plurality of pixel units (as shown by pixel units 60), driving lines 40 and 42, an ESD protection device 20, and an ESD protection circuit 30. The driving lines 40 and 42 are coupled to a driving circuit 80. The driving lines 40 and 42 are, for example, data driving lines or scan driving lines, and are used for providing a driving signal to the pixel units 60 of the flat display panel 10. The driving circuit 80 is, for example, a data driving circuit or a scan driving circuit, and is used for providing the driving signal. The pixel units 60 are disposed in a display region 72 of the substrate 70 for displaying an image frame. It should be noted that only one driving line coupled to each of the pixel units 60 is shown in FIG. 1, but in fact, there should be two driving lines coupled to the pixel units 60, i.e., the data driving line and the scan driving line respectively.

Following the preceding paragraph, the ESD protection device 20 and the ESD protection circuit 30 are disposed in a non-display region 71 of the substrate 70. When the driving line 40 receives a voltage larger than a threshold voltage Vth, the ESD protection device 20 is conducted to discharge the static electricity away through the static protection circuit 30, wherein the ESD protection circuit 30 may also be called as a short ring. When the driving line 40 generates the static electricity with the high voltage, the pixel units 60 coupled to the driving line 40 may be damaged permanently. Accordingly, the ESD protection device 20 conducts the static electricity with the high voltage to the ESD protection circuit 30. Thereby, the pixel units 60 are prevented from being damaged by the static electricity.

However, the above-mentioned method has a critical disadvantage that a crossing place 50 of the driving line 40 and the ESD protection circuit 30 may easily be damaged by the static electricity, which causes an electrical connection between the driving line 40 and the ESD protection circuit 30. Once the driving line 40 and the ESD protection circuit 30 are electrically connected, the current leakage of the flat display panel 10 occurs. In such circumstance, the pixel units 60 coupled to the driving line 40 can not display normal color scale levels and brightness.

FIG. 2 is a schematic view illustrating occurrence of current leakage of a conventional ESD protection circuit. Please refer to FIG. 2, it is assumed that the driving circuit 80 provides the driving signal (current $I_1$) through the driving line 40 in order to drive the pixel units 60. However, the driving line 40 and the ESD protection circuit 30 are electrically connected because the crossing place 50 is damaged by the static electricity. Therefore, the current $I_1$ has partial current $\Delta I_1$ leaked to the ESD protection circuit 30, and only current $I_1-\Delta I_1$ remains in the driving line 40 for being provided to the pixel units 60. From the aspect of the voltage, it is assumed that the driving signal (voltage $V_1$) is provided through the driving line 40 to drive the pixel units 60. However, the driving line 40 and the ESD protection circuit 30 are electrically connected because the crossing place 50 is damaged by the static electricity. Therefore, the voltage $V_1$ is lowered due to the influence of the ESD protection circuit 30. Certainly, the pixel units 60 can not display the normal color scale levels and the brightness. Further, the leaking current $\Delta I_1$ is usually large, and therefore, causes a line defect of the flat display panel 10. Thereby, the value of the flat display panel is greatly affected.

Therefore, LCD manufacturers have been looking for suitable solutions to overcome the aforementioned problems.

SUMMARY OF THE INVENTION

The present invention is directed to a flat display panel which can avoid a line defect.

The present invention provides a flat display panel includes a substrate, a first driving line, a second driving line, and an ESD protection circuit. The substrate has a plurality of pixel units. The first driving line is disposed on the substrate and coupled to a portion of the pixel units. The second driving line is disposed on the substrate and coupled to a portion of the pixel units. The ESD protection circuit is disposed around the substrate. The ESD protection circuit includes a first crossing line, a second crossing line, and a first ESD protection device. The first crossing line crosses over the first driving line. The second crossing line crosses over the second driving line. The first ESD protection device is electrically connected to the first crossing line and the second crossing line.

According to one embodiment of the present invention, the first driving line is coupled to a driving circuit, and the first driving line includes a first transmission line and a second transmission line. A first end of the first transmission line is coupled to the driving circuit, a second end of the first transmission line is coupled to a node, and the node is coupled to a portion of the pixel units, so as to transmit a driving signal provided by the driving circuit to a portion of the pixel units. The second transmission line is connected to the first transmission line in parallel.

According to one embodiment of the present invention, the first driving line is parallel to the second driving line. According to another embodiment of the present invention, the first driving line and the second driving line are disposed on a first plane, the ESD protection circuit is disposed on a second plane, and the first plane and the second plane are not the same plane. Moreover, the ESD protection circuit may further include a second ESD protection device. A first end of the second ESD protection device is coupled to the first driving line, while a second end of the ESD protection device is coupled to the ESD protection circuit.

According to one embodiment of the present invention, the first ESD protection device may further include a diode, a thin film transistor, a capacitor, or a combination thereof.

The present invention adopts the ESD protection circuit comprising the first crossing line, the second crossing line, and the first ESD protection device. In addition, the first crossing line and the second crossing line respectively cross over the first driving line and the second driving line. Also, the first ESD protection device is electrically connected to the first crossing line and the second crossing line. Thereby, occurrence of current leakage can be avoided.

In order to make the aforementioned and other objects, features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
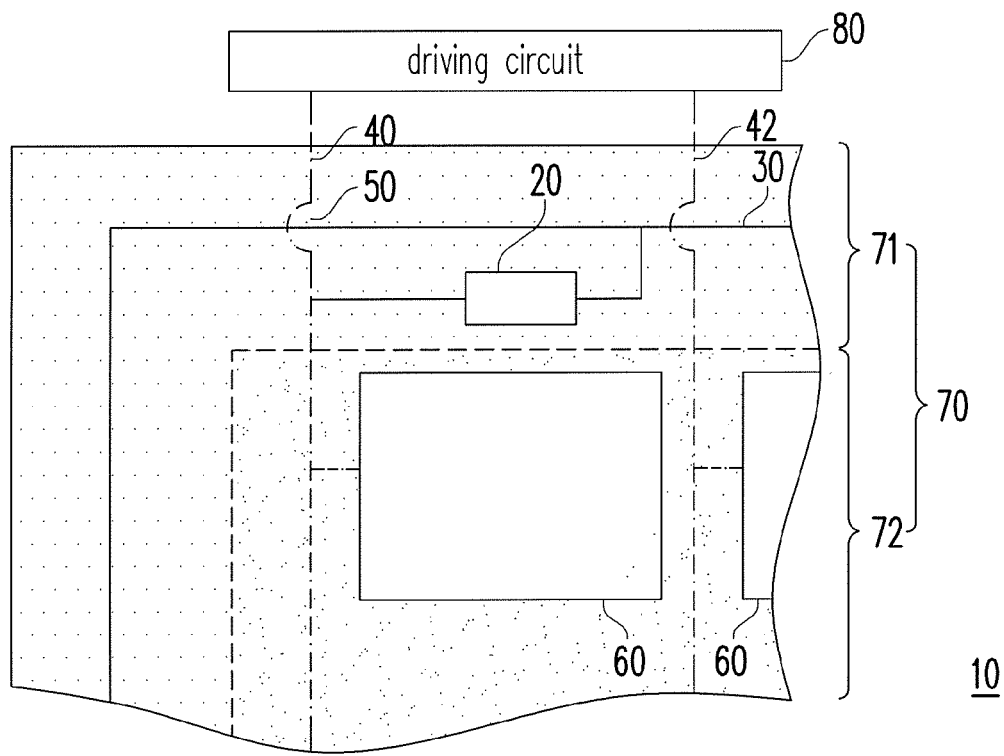
FIG. 1 is a schematic view of a conventional electronic static discharge (ESD) protection circuit.
Figure 2:
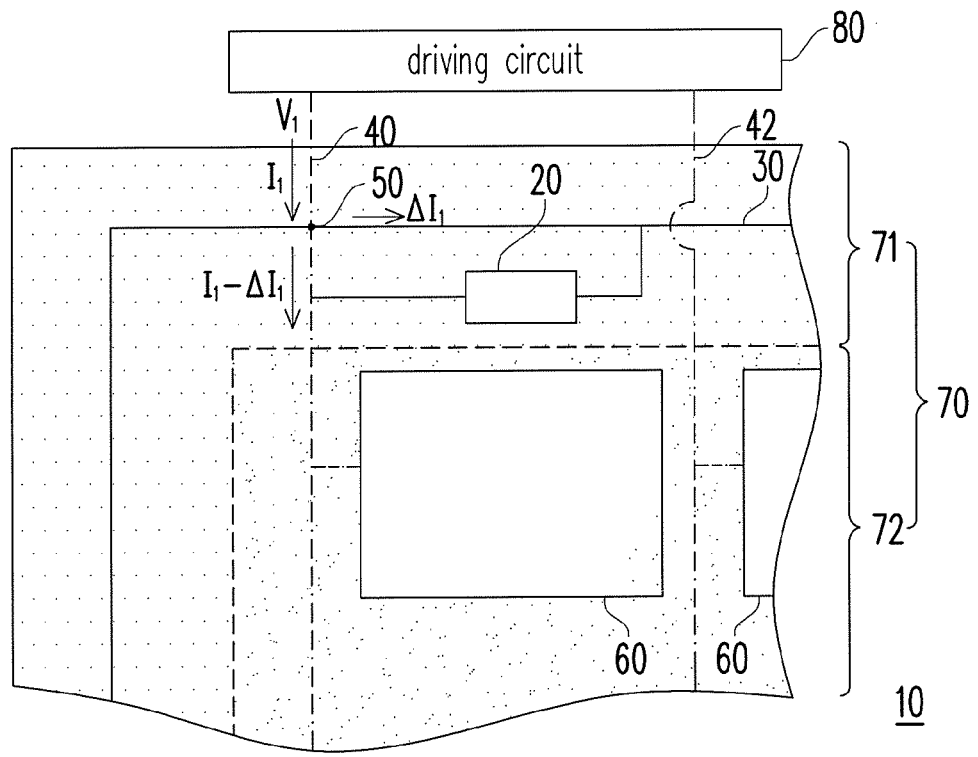
FIG. 2 is a schematic view illustrating occurrence of current leakage of a conventional ESD protection circuit.
Figure 3:
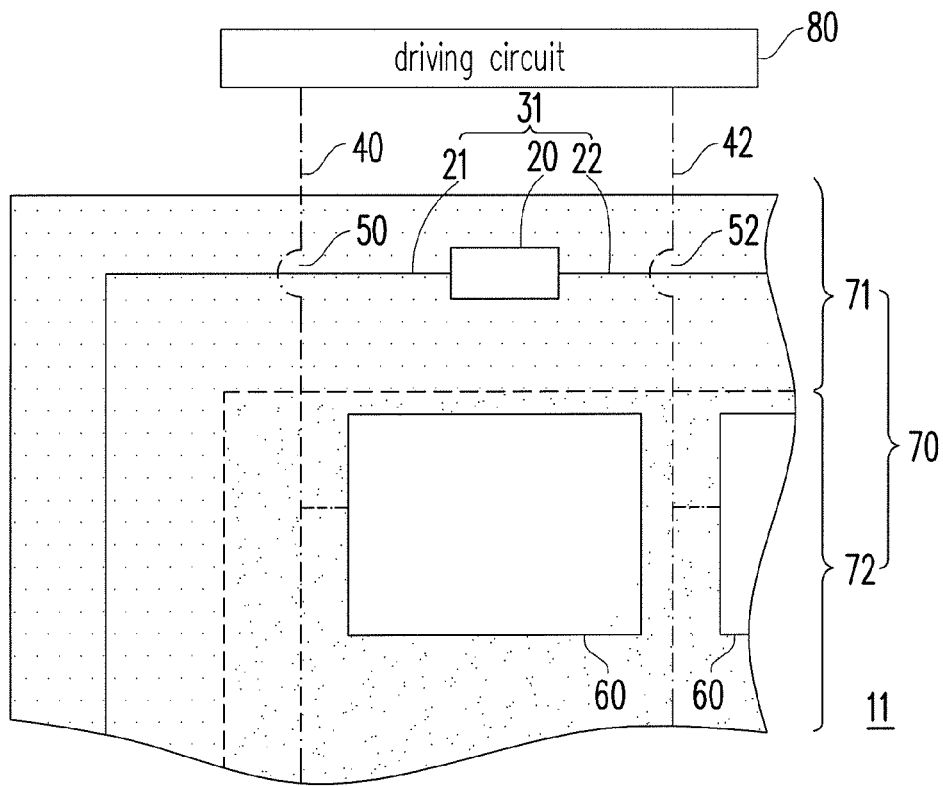
FIG. 3 is a schematic view of a flat display panel having an ESD protection circuit according to a first embodiment of the present invention.

FIG. 3 is a schematic view of a flat display panel having an electronic static discharge (ESD) protection circuit according to a first embodiment of the present invention. Referring to FIG. 3, a flat display panel 11 is a thin-film transistor liquid crystal display (TFT-LCD) panel as an example. In another embodiment, the flat display panel 11 may also be an organic light emitting diode (OLED) display panel. The flat display panel 11 includes a substrate 70, driving lines 40 and 42, and an ESD protection circuit 31. A display region 72 of the substrate 70 has a plurality of pixel units (as shown by pixel units 60). The driving lines 40 and 42 are disposed on the substrate 70, and coupled to a driving circuit 80 and the pixel units 60.

Following the preceding paragraph, the driving circuit 80 is, for example, a data driving circuit. The driving lines 40 and 42 are, for example, data driving lines. According to another embodiment, the driving circuit 80 may also be a scan driving circuit, and the driving lines 40 and 42 may also be scan driving lines.

On the other hand, the ESD protection circuit 31 is disposed around the substrate 70. For example, the ESD protection circuit 31 is disposed in a non-display region 71 of the substrate 70. The ESD protection circuit 31 includes an ESD protection device 20 and crossing lines 21 and 22. The crossing lines 21 and 22 respectively cross over the driving lines 40 and 42 in crossing places 50 and 52, wherein the crossing lines 21 and 22 are constituted by a good conductor. The ESD protection device 20 is electrically connected to the crossing lines 21 and 22. In addition, in the present embodiment, the driving lines 40 and 42 may be disposed in the same plane, while the ESD protection circuit 31 may be disposed in another plane.

In the present embodiment, the ESD protection circuit 31 is used to release static electricity. When one end of the ESD protection device 20 receives a voltage larger than a threshold voltage Vth, the ESD protection device 20 is conducted, so as to release the static electricity. The ESD protection circuit 31 may be in a floating state.

To further explain the spirit of the present invention to persons of ordinary skills in the art and to incorporate the flat display panel 11 in the above-mentioned example, the ESD protection device 20 in the present embodiment is a thin film transistor as an example to describe the present embodiment. The ESD protection device 20 can be embodied in many different ways, e.g. a diode, a capacitor, a resistor, or a combination of the above-mentioned and other elements, and etc. Therefore, the present invention should not be limited to the specific embodiment.

Figure 4:
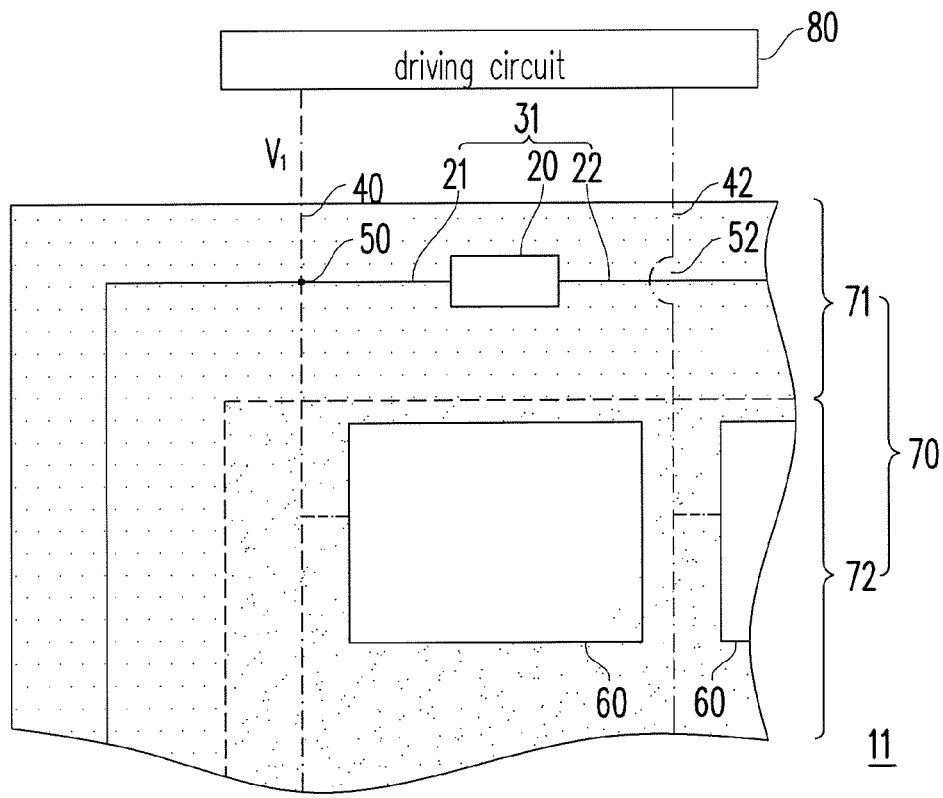
FIG. 4 is a schematic view illustrating the way that the ESD protection circuit prevents the current leakage according to the first embodiment of the present invention.

FIG. 4 is a schematic view illustrating the way that the ESD protection circuit prevents the current leakage according to the first embodiment of the present invention. Please refer to both FIGS. 3 and 4. In FIG. 4, it is assumed that the crossing place 50 of the flat display panel 11 of FIG. 3 is damaged by ESD, so that the driving line 40 and the crossing line 21 are electrically connected to each other. At this time, if the driving line 40 provides a driving signal with a voltage V1 to the pixel units 60, the leaking current is not overly large, even the voltage V1 is larger than the threshold voltage Vth of the ESD protection device 20, because the voltage V1 belongs to a general voltage. Therefore, the driving signal with the voltage V1 is not lowered for the influence of the ESD protection circuit 31. In other words, although the driving line 40 and the crossing line 21 are electrically connected to each other, the pixel units 60 can display normal color scale levels and brightness. Thereby, a line defect of the flat display panel 11 which may be caused by the damage of the ESD can be avoided. Moreover, when the ESD occurs again, the ESD protection device 20 is conducted to distribute the effect of the ESD to the whole flat display panel 11, so as to prevent the pixel units 60 coupled to the driving line 40 from being damaged by the ESD.

Figure 5:
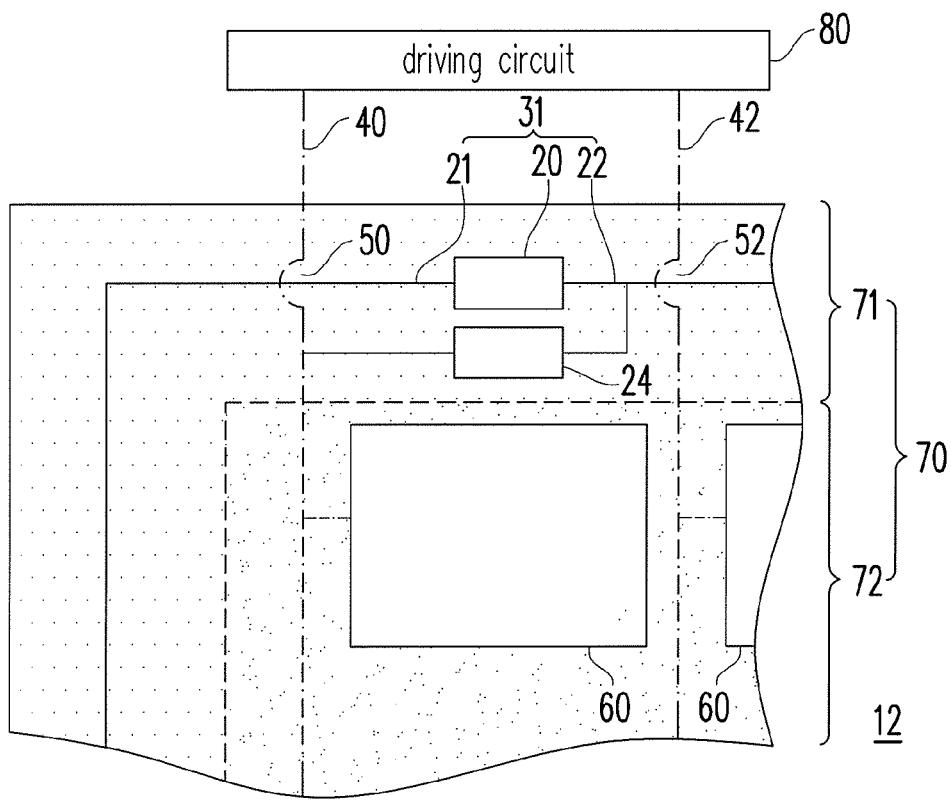
FIG. 5 is a schematic view of a flat display panel having the ESD protection circuit according to a second embodiment of the present invention.

Persons of ordinary skill in the art can modify the implementation according to the present invention and the teaching of the above embodiments as required. FIG. 5 is a schematic view of the flat display panel having the ESD protection circuit according to a second embodiment of the present invention. Referring to FIG. 5, numeral numbers and symbols the same as the above embodiments can refer to the implementation of the above embodiments, so are not detailed herein. It should be noted that the flat display panel 12 of the present embodiment further includes an ESD protection device 24. The ESD protection device 24 has a first end coupled to the driving line 40 and a second end coupled to the ESD protection circuit 31. The advantage of this method lies in that the ESD protection device 24 prevents the pixel units 60 coupled to the driving lines 40 and 42 from being damaged by the ESD. Moreover, using the ESD protection device 20 of the present embodiment can further prevent the crossing places 50 and 52 from being damaged by the ESD, and thus the occurrence of the current leakage is avoided.

Figure 6:
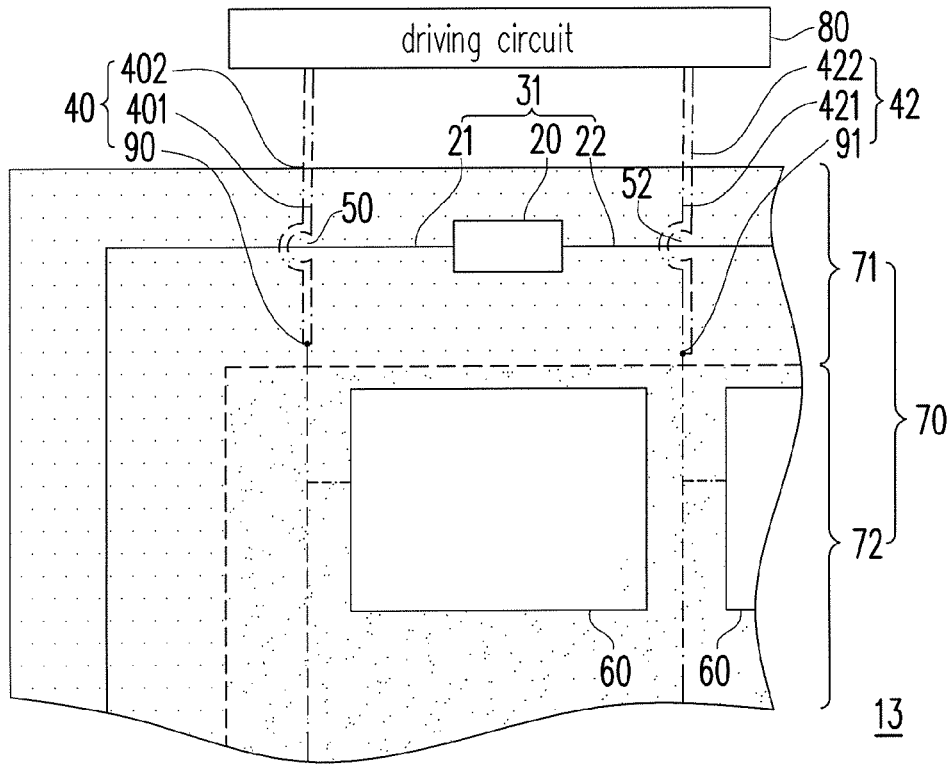
FIG. 6 is a schematic view of a flat display panel having the ESD protection circuit according to a third embodiment of the present invention.

Persons of ordinary skill in the art can modify the implementation according to the spirit of the present invention and the teaching of the above embodiments as required. FIG. 6 is a schematic view of the flat display panel having the ESD protection circuit according to a third embodiment of the present invention. Referring to FIG. 6, numeral numbers and symbols the same as the above embodiments can refer to the implementation of the above embodiments, so are not detailed herein. It should be noted that the driving line 40 of the flat display panel 13 includes transmission lines 401 and 402. A first end and a second end of the transmission line 401 are respectively connected to the driving circuit 80 and a node 90, so as to transmit the driving signal provided by the driving circuit 80 to the node 90. The transmission line 402 is connected to the transmission line 401 in parallel. The node 90 is coupled to the pixel units 60 for collecting the driving signal, so as to drive the pixel units 60.

According to the present embodiment, the advantage of the driving line 40 including transmission lines 401 and 402 lies in that the driving line 40 still can transmit the driving signal provided by the driving circuit 80 to the pixel units 60 coupled to the driving line 40, even if any one of the transmission lines 401 and 402 is broken. Likewise, it can be deduced that the driving line 42 can also include transmission lines 421 and 422, and a node 91, and others are not detailed herein. Thereby, the risk resulted from the driving line being broken is lowered, and the occurrence of the current leakage is avoided by preventing the crossing places 50 and 52 from being damaged by the ESD. Furthermore, the driving lines can be divided into more transmission lines, so as to further lower the risk resulted from the driving line being broken.

In summary, the present invention can prevent the occurrence of the current leakage by using the ESD protection circuit. In addition, the present invention discussed in the embodiments thereof has at least the following advantages:

1. The ESD protection circuit includes the first crossing line, the second crossing line, and the first ESD protection device. The first crossing line and the second crossing line respectively cross over the first driving line and the second driving line. Also, the first ESD protection device is electrically connected to the first crossing line and the second crossing line. Thereby, the occurrence of the current leakage is avoided by preventing the crossing lines of the driving line and the ESD protection circuit from being damaged by the ESD.

2. The ESD protection device is coupled between the driving line and the ESD protection circuit, so that the pixel units of the flat display panel are prevented from being damaged by the ESD.

3. The driving line includes a plurality of transmission lines connected in parallel, and each of the transmission lines converges at the same node, thereby preventing a mistake that the transmission lines are not able to transmit the driving signal when a portion of the transmission lines is broken.

4. A plurality of ESD protection devices is disposed on the ESD protection circuit to prevent more driving lines from leaking current.

Although the present invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A flat display panel, comprising:
   a substrate having a plurality of pixel units;
   a first driving line, disposed on the substrate and coupled to a first portion of the pixel units;
   a second driving line, disposed on the substrate and coupled to a second portion of the pixel units; and
   an Electronic Static Discharge (ESD) protection circuit, disposed on and around the substrate and electrically isolated from the first driving line and the second driving line, the ESD protection circuit comprising:
   a first crossing line, crossing over the first driving line and electrically isolated from the first driving line;
   a second crossing line, crossing over the second driving line and electrically isolated from the second driving line; and
   a first ESD protection device, electrically connected between the first crossing line and the second crossing line, and disposed between and electrically isolated from the first driving line and the second driving line,
   wherein when one end of the first ESD protection device receives a voltage larger than a threshold voltage of the first ESD protection device, the first ESD protection device is conducted to release a static electricity from either the first driving line or the second driving line to only the ESD protection circuit in a floating state,
   wherein the ESD protection circuit is an inner short ring.

2. The flat display panel according to claim 1, wherein the first driving line is coupled to a driving circuit, and the first driving line comprises:
   a first transmission line, a first end of the first transmission line being coupled to the driving circuit, a second end of the first transmission line being coupled to a node, the node being coupled to the first portion of the pixel units, thereby transmitting a driving signal provided by the driving circuit to the first portion of the pixel units; and
   a second transmission line, connected to the first transmission line in parallel.

3. The flat display panel according to claim 1, wherein the first driving line and the second driving line are disposed on a first plane, the ESD protection circuit is disposed on a second plane, and the first plane and the second plane are not the same plane.

4. The flat display panel according to claim 1, further comprising:
   a second ESD protection device, a first end of the second ESD protection device being coupled to one of the first driving line and the second driving line, a second end of the second ESD protection device being coupled to one of the first crossing line and the second crossing line of the ESD protection circuit.

5. The flat display panel according to claim 1, wherein the first ESD protection device comprises a diode, a thin film transistor, a capacitor, or a combination thereof.

* * * * *